(12) United States Patent
Marshall

(10) Patent No.: US 7,030,486 B1
(45) Date of Patent: Apr. 18, 2006

(54) HIGH DENSITY INTEGRATED CIRCUIT PACKAGE ARCHITECTURE

(76) Inventor: Paul N. Marshall, 41 Cotswold Way, Avon, CT (US) 06001

( * ) Notice: Subject to any disclaimer, the term of this patent is extended or adjusted under 35 U.S.C. 154(b) by 0 days.

(21) Appl. No.: 10/662,091

(22) Filed: Sep. 12, 2003

Related U.S. Application Data

(60) Provisional application No. 60/474,005, filed on May 29, 2003.

(51) Int. Cl.
*H01L 23/24* (2006.01)

(52) U.S. Cl. .............. 257/712; 257/777; 361/696; 361/697; 361/701; 361/702; 361/709; 361/711; 361/760; 29/888.045; 29/890.03; 29/890.032; 29/890.045; 29/895.212; 29/726; 29/726.5; 438/108; 438/109

(58) Field of Classification Search .......... 257/712, 257/777, 685, 686, E31.131, E23.051; 361/696, 361/697, 701, 702, 709, 711, 760; 29/888.045, 29/890.03, 890.032, 890.045, 895.212, 726, 29/726.5; 438/108, 109
See application file for complete search history.

(56) References Cited

U.S. PATENT DOCUMENTS

| | | | | |
|---|---|---|---|---|
| 3,573,574 A | * | 4/1971 | Davis .................. | 257/715 |
| 3,705,332 A | * | 12/1972 | Parks .................. | 361/795 |
| 4,392,153 A | * | 7/1983 | Glascock et al. ...... | 257/746 |
| 5,016,138 A | * | 5/1991 | Woodman ............. | 361/688 |
| 5,391,917 A | * | 2/1995 | Gilmour et al. ........ | 257/690 |
| 5,475,215 A | | 12/1995 | Hsu ................. | 250/227.11 |
| 5,579,207 A | * | 11/1996 | Hayden et al. ........ | 361/790 |
| 5,604,377 A | | 2/1997 | Palagonia ............. | 257/685 |
| 5,714,802 A | * | 2/1998 | Cloud et al. .......... | 257/726 |
| 5,923,796 A | | 7/1999 | Feldman et al. ....... | 385/14 |
| 5,955,010 A | * | 9/1999 | Okada et al. .......... | 264/1.25 |
| 6,097,857 A | | 8/2000 | Feldman ............... | 385/14 |
| 6,230,252 B1 | | 5/2001 | Passint et al. ......... | 712/12 |
| 6,353,264 B1 | * | 3/2002 | Coronel et al. ........ | 257/777 |
| 6,355,976 B1 | | 3/2002 | Faris ................. | 257/686 |
| 6,452,705 B1 | | 9/2002 | Paxton ................ | 359/159 |
| 6,492,720 B1 | * | 12/2002 | Yamaguchi et al. ..... | 257/686 |
| 6,566,232 B1 | * | 5/2003 | Hara et al. ........... | 438/455 |
| 6,577,013 B1 | * | 6/2003 | Glenn et al. .......... | 257/777 |
| 6,611,057 B1 | | 8/2003 | Mikubo et al. ........ | 257/714 |
| 6,659,661 B1 | * | 12/2003 | Deguchi et al. ....... | 396/611 |
| 6,727,567 B1 | * | 4/2004 | Bastek et al. ......... | 257/506 |
| 6,760,224 B1 | * | 7/2004 | Moden et al. ......... | 361/719 |

OTHER PUBLICATIONS

International Search Report, International Application No: PCT/US04/16045;Applicant's File Reference MPN-0001-PCT; International Filing Date May 21, 2004; Date of Mailing Jul. 22, 2005; 5 pages.
Written Opinion of the International Searching Authority; International Application No: PCT/US04/16045; Applicant's file Reference MPN-0001-PCT; International Filing Date May 21, 2004; Date of Mailing Jul. 22, 2005.

* cited by examiner

*Primary Examiner*—Kenneth Parker
*Assistant Examiner*—Chris C. Chu
(74) *Attorney, Agent, or Firm*—Cantor Colburn LLP

(57) ABSTRACT

This invention relates to a high density architecture for an integrated circuit package (10) in which a plurality of circuit communication wafers (12) are disposed in a stack with a plurality of cooling plates (14) between them, and wherein circuit communication between the communication wafers (12) is provided from wafer to wafer through the cooling plates (14). In addition, the communication wafers (12) may have integrated circuit chips (18) deposited on both sides of the wafer, and chip-to-chip communication may be provided from one surface of the wafer to another through the wafer. The resulting integrated circuit package may have any desired geometrical shape and will permit heat exchange, power and data exchange to occur in three generally mutually orthogonal directions through the package.

15 Claims, 8 Drawing Sheets

HIGH DENSITY INTEGRATED CIRCUIT PACKAGE ARCHITECTURE

CROSS-REFERENCE TO RELATED APPLICATION

This application claims the benefit of U.S. provisional application No. 60/474,005, filed May 29, 2003.

BACKGROUND OF THE INVENTION

1. Field of the Invention

This invention relates to integrated circuitry and, in particular, to the architecture of a high density integrated circuit package.

Modern computers and other electronic devices make use of integrated circuitry, which is favored for its efficiency of manufacture, speed of operation and low power consumption. As is known in the art, these advantages increase as the density of circuit elements in the integrated circuitry grows. Conversely, these advantages can be diminished by the inadequate removal of heat produced by the operation of the integrated circuit, by the introduction of lengthy connectors between integrated circuit chips and other such factors. In designing packaging for integrated circuits, it is generally desired to pursue an architecture that enhances the advantages of the integrated circuitry.

2. Related Art

Published United States patent application number U.S. 2002/0053726 A1 of Mikubo et al, entitled "Semiconductor Device Attaining Both High Speed Processing And Sufficient Cooling Capacity", filed Nov. 8, 2001, discloses a semiconductor device in which a plurality of wiring boards carry semiconductor modules (e.g., memory chips) and an integrated circuit chip (IC chip) that is connected to the wiring board. The IC chip carries a microminiature heat sink secured to it. A plurality of the wiring boards are stacked one above the other and the circuits thereon are interconnected via socket connectors. A coolant is flowed through the heat sinks on each of the IC chips in the stack of wiring boards (see paragraph 0055 and FIGS. 5 and 6). A heat sink may be formed from two metal blocks, one of which has a series of fins that define grooves on one surface and the other of which has a mating surface for the fins. The blocks are secured together with the fins of the first block pressing against the receiving surface of the second block to form a plurality of channels between the two blocks. See paragraphs 0079 through 0086.

SUMMARY OF THE INVENTION

This invention relates to an integrated circuit package comprising a plurality of circuit wafers each comprising a non-electrically conductive substrate on which is carried one or more integrated circuits with at least one wafer configured for signal communication outside the package, and a plurality of non-electrically conductive cooling plates alternately layered with the circuitry wafers, wherein the circuitry wafers and cooling plates are layered in a first direction that defines a first axis of the package, and wherein signal communication between circuitry wafers within the package occurs in a direction along the first axis, wherein the cooling plates are configured to direct heat flow in a path that is transverse to the first axis, and wherein at least one of power, data signal and control signal communication is supplied to the package from a direction that is transverse to both the first axis and the direction of heat flow.

According to one aspect of the invention, the cooling plates may define flow conduits therethrough for coolant fluid, wherein each flow conduit has two conduit ends and wherein the conduit ends are aligned at two different positions on the side of the package, and wherein the package further comprises manifolds that provide a port through which to provide coolant fluid to a plurality of flow conduits and a port to collect cooling fluid from a plurality of flow conduits, and wherein the manifolds are configured to permit access to the side of the package for providing at least one of power, data signal and control signal communication to circuitry wafers in the package.

The invention also provides an integrated circuit package comprising a plurality of circuitry wafers each comprising a non-electrically conductive substrate on which is carried one or more integrated circuits with at least one circuitry wafer configured for signal communication outside the package, and a plurality of non-electrically conductive cooling plates alternately layered with the circuitry wafers, and comprising circuitry wafers and cooling plates configured so that integrated circuits on at least two circuitry wafers in the package communicate with each other through an intervening cooling plate.

According to one aspect of the invention, the package may comprise cooling plates that define flow conduits therethrough for coolant fluid. Each flow conduit may have two conduit ends and the conduit ends may be aligned at two different sides of the package. The package may further comprise manifolds that each provide a port through which to provide coolant fluid to a plurality of flow conduits and a port to collect cooling fluid from a plurality of flow conduits. Optionally, the manifolds may be configured to permit access to the side of the package for providing power and/or control signals to circuitry wafers in the package.

According to another aspect of the invention, at least one cooling plate may comprise a plate signal path therethrough and a first IC on a circuitry wafer on one side of the cooling plate may be positioned for signal communication through the plate signal path. Optionally, there may be a second IC on a circuitry wafer on the other side of the cooling plate, positioned for communication with the first IC through the plate signal path. Optionally, the first IC may comprise an optical IC and the plate signal path may comprise a plate optical signal path, and the second IC may be a second optical IC.

According to another aspect of the invention, at least one circuitry wafer may comprise a substrate having a signal path therethrough and a first IC may be positioned on the substrate for signal communication therethrough. Optionally, the first IC may comprise an optical IC and the substrate signal path may be an optical signal path. Optionally, there may be a second IC on a substrate, optionally a second optical IC, positioned for signal communication with the first IC via the substrate signal path.

According to still another aspect of the invention, the circuitry wafers and cooling plates may be layered in a first direction along a first axis, and the circuitry wafers and cooling plates may be configured to permit signal communication between circuitry wafers in the first direction, the cooling plates may be configured to direct heat flow along a path that is transverse to the first axis and at least one of power, data signal and control signal communication may be supplied to the package from a direction that is transverse to both the first axis and the direction of heat flow.

DETAILED DESCRIPTION OF THE INVENTION AND PREFERRED EMBODIMENTS THEREOF

This invention relates to a high density architecture for an integrated circuit package in which a plurality of circuitry wafers are disposed in a stack and are alternately layered with a plurality of cooling plates, and wherein signal communication to and from at least one circuitry wafer is provided through at least one cooling plate. Each circuitry wafer comprises a substrate with one or more integrated circuit chips thereon. There may be integrated circuit (IC) chips deposited on both sides of a substrate, and chip-to-chip signal communication may be provided through a substrate from a chip on one surface of the substrate to a chip on the other. The cooling plates may comprise solid, heat-sink structures or may define conduits therethrough for the flow of a heat exchange fluid. An integrated circuit package according to this invention may have any desired geometrical shape and will permit heat exchange for cooling the package and one or more of electronic power and data signal and control signal communication, to occur in three generally mutually transverse, e.g., preferably orthogonal, directions through the package. Thus, the arrangement of manifolds, modular connectors and other coupling devices that facilitate these functions from outside the package can be simpler and/or more easily designed than for prior art IC packages.

Figure 1A:
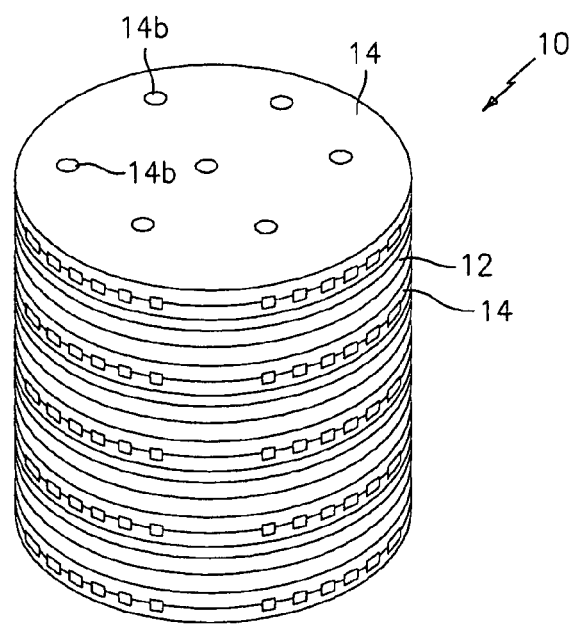
FIG. 1A is a schematic perspective view of an integrated circuit package according to one particular embodiment of the present invention.
Figure 1B:
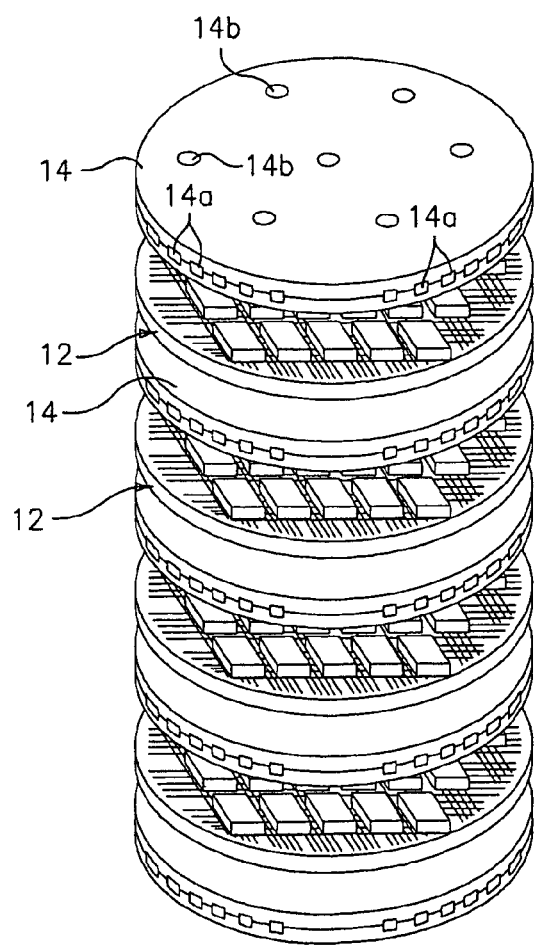
FIG. 1B is an exploded view of the integrated circuit package of FIG. 1A.

An integrated circuit (IC) package in accordance with one embodiment of this invention is shown in FIGS. 1A and 1B. IC package 10 has an optional cylindrical configuration and it comprises a plurality of circular circuitry wafers 12 arranged in substantially parallel relation to each other with a plurality of circular cooling plates 14 disposed between them to form a stack and, preferably, with cooling plates for the top and/or the bottom strata of the stack. As explained more fully below, each cooling plate comprises a generally planar structure having a pair of planar surfaces and a plurality of channels 14a through which a cooling fluid may flow. In addition, each cooling plate 14 has one or more communication apertures 14b formed therein to allow electrical communication from one side of the cooling plate to the other, e.g., from a circuitry wafer immediately below the cooling plate in the stack to the circuitry layer immediately above.

The circuitry wafers and cooling plates 14 are stacked in a first direction that defines a first axis of the package. Communication apertures 14b thus allow electrical signal communication, e.g., data exchange or transfer and/or the transfer of control signals, with and/or within the package in a direction generally parallel with the first axis.

Figure 2:
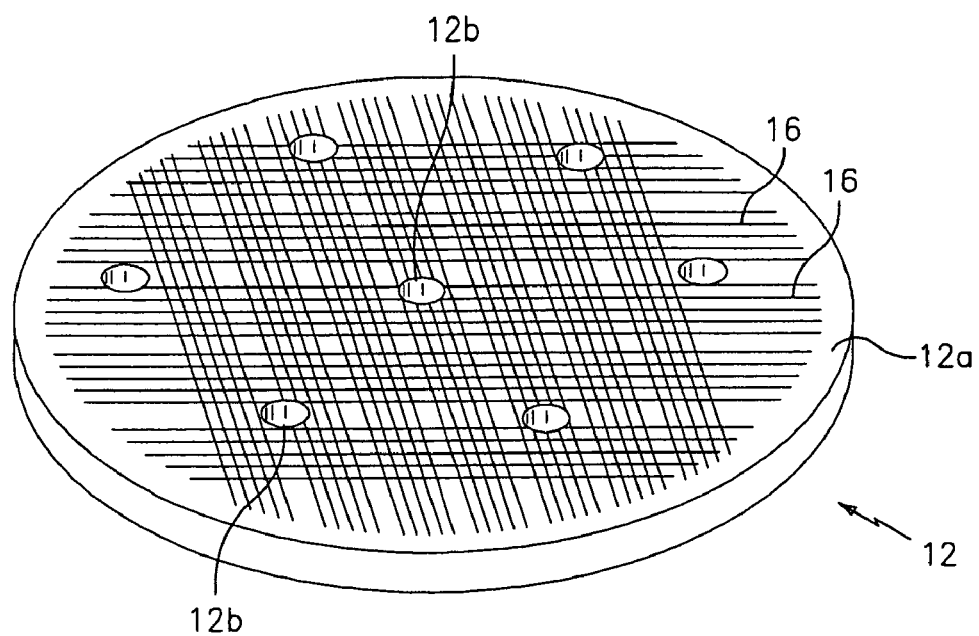
FIG. 2 is a schematic perspective view of a circuit substrate in the integrated circuit package of FIG. 1A, showing communication/power bus wiring and apertures on the substrate.
Figure 3:
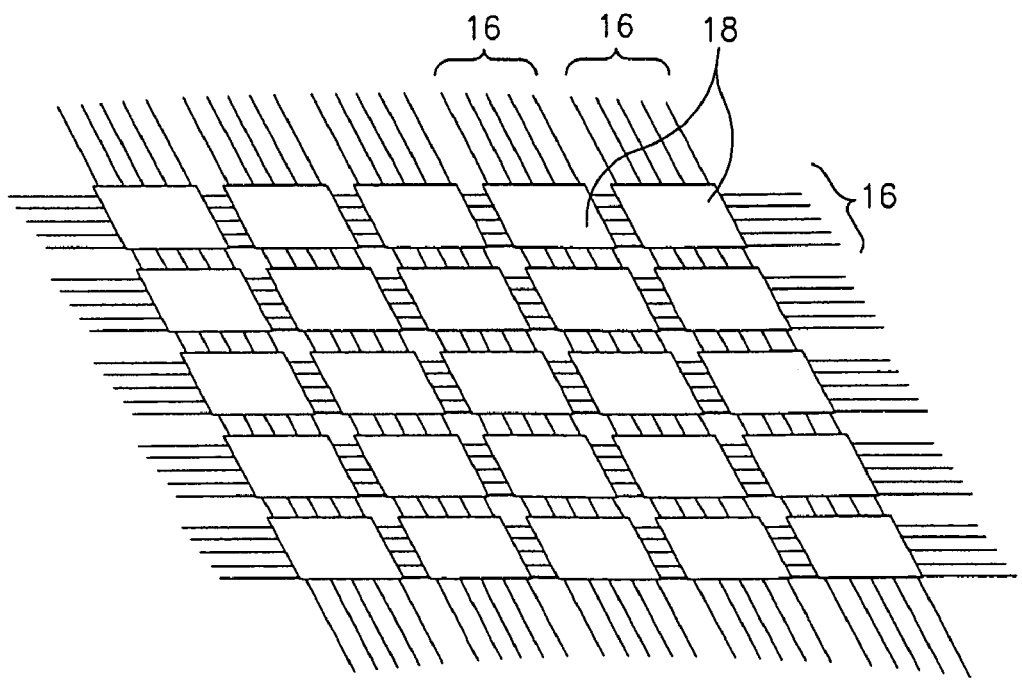
FIG. 3 is a schematic perspective view of an array of integrated circuit chips mounted on the communication/power bus wiring of the substrate of FIG. 2.

Each circuitry wafer 12 comprises a substrate 12a as shown in FIG. 2. The substrate 12a preferably comprises a layer of silicon. On the substrate 12a there is formed a bus channel 16, which comprises lines of electrical conductors that provide power to, and/or control and/or data signal communication with, integrated circuit chips that can be mounted on the substrate (in communication with a bus) using any suitable technology, e.g., flip chip bonding (in which an IC chip is equipped with an array of contact pads configured to coincide with matched junction points for the bus). The bus could also include control circuitry for both signal and power conditioning. Typical signal control functions provide bus contention, crossbar switches, and error correction; whereas power conditioning control functions include voltage regulation, over current protection, and error correction. By providing such circuitry in the bus channels, there will be more room for memory and processor chips to be mounted on either side of this wafer. Thus, as shown in FIG. 3, a plurality of IC chips 18, which may comprise processor chips, memory chips, or the like, can be deposited on the bus channel 16 so that the chips properly communicate with one another and can be accessed externally via outgoing and incoming bus lines on the periphery of the chip array. Optionally, a communication/power bus and array of IC chips thereon may be deposited on both sides of the substrate.

Referring again to FIG. 2, substrate 12a comprises one or more communication apertures 12b, which permit signal communication through the substrate 12a. Optionally, the communication aperture 12b may accommodate a metallic signal carrier joined to a chip or communication/power bus on opposite sides of the substrate, but preferably, aperture 12b is optically transparent (e.g., hollow or filled with a light-transmissive material such as a short length of optical fiber) so that optical signal communication can be achieved therethrough using any desired optical integrated circuit (optical IC) signaling technology, e.g., light-emitting chips such as laser chips, light-emitting diodes (LEDs), etc., and light-receiving and signaling devices such as photodiodes, phototransistors, etc.

Figure 4:
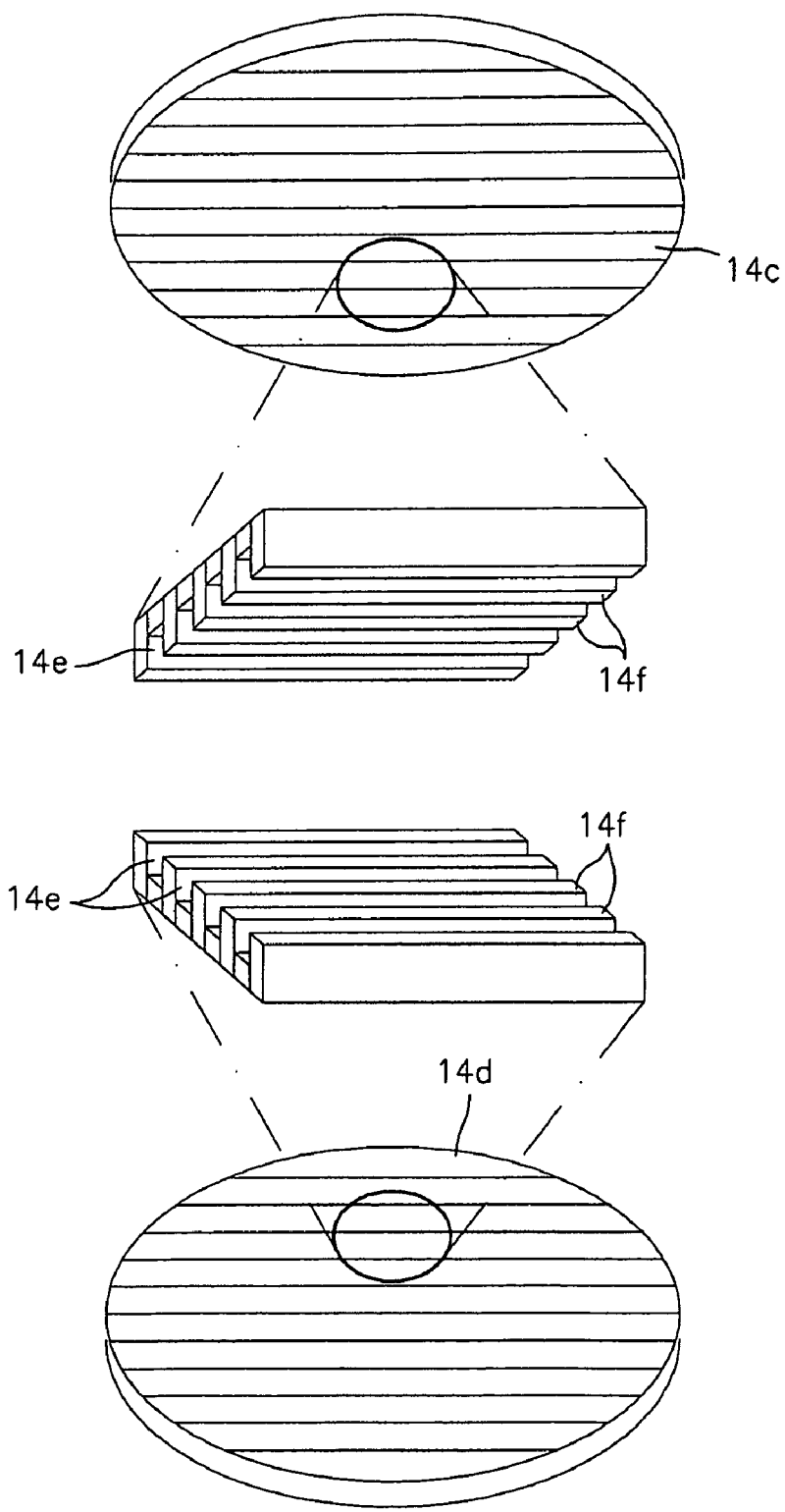
FIG. 4 is a schematic exploded perspective view of a cooling plate in the integrated circuit package of FIG. 1A.

In an optional but preferred construction of the cooling plates 14 (FIGS. 1A, 1B), each cooling plate is formed from a pair of mated, plate-like cooling elements. The cooling elements are configured to have mating surfaces which, when joined together, form coolant flow channels extending through the resulting cooling plate. For example, as seen in FIG. 4, the mating surfaces of the two cooling elements 14c and 14d may have grooves 14e formed therein. The grooves are separated by ridges 14f that can be mutually aligned, so that when cooling elements 14c and 14d are secured together, they form a cooling plate 14 (FIG. 1B) having channels 14a extending therethrough. (Alternatively, the mating surface of one of the cooling elements may be flat, and the channels may be defined by ridges in the mating surface of the other cooling element.) Each channel has at least two ends so that there can be at least one inflow end through which coolant fluid can enter the cooling plate and at least one outflow end from which coolant fluid can exit the cooling plate. In the illustrated embodiment, the channels run straight through the cooling plate with their ends at opposite sides of the plate. When the cooling plates are layered in the IC package, the ends of the channels are preferably vertically aligned with each other to permit the use of inflow and outflow manifolds through which coolant fluid is easily flowed into and withdrawn from the IC package. In alternative embodiments, the channels may define serpentine or other non-linear paths through the cooling plates.

In addition to the grooves and ridges, each cooling element has communication apertures 14b formed therein and, when the cooling elements are secured face to face to form a cooling plate (14 FIG. 1B), the communication apertures 14b are aligned so that they can be used for signal communication from a circuitry wafer on one side of the cooling plate through to the other side of the cooling plate, e.g., to another circuitry wafer, to a communication/power bus, etc. As with the communication apertures in the circuitry wafers, the cooling element communication apertures may accommodate electric communication via a conductor or may be optically open (i.e., either hollow or transmissive of a light signal), for optical signal transfer therethrough.

Figure 5:
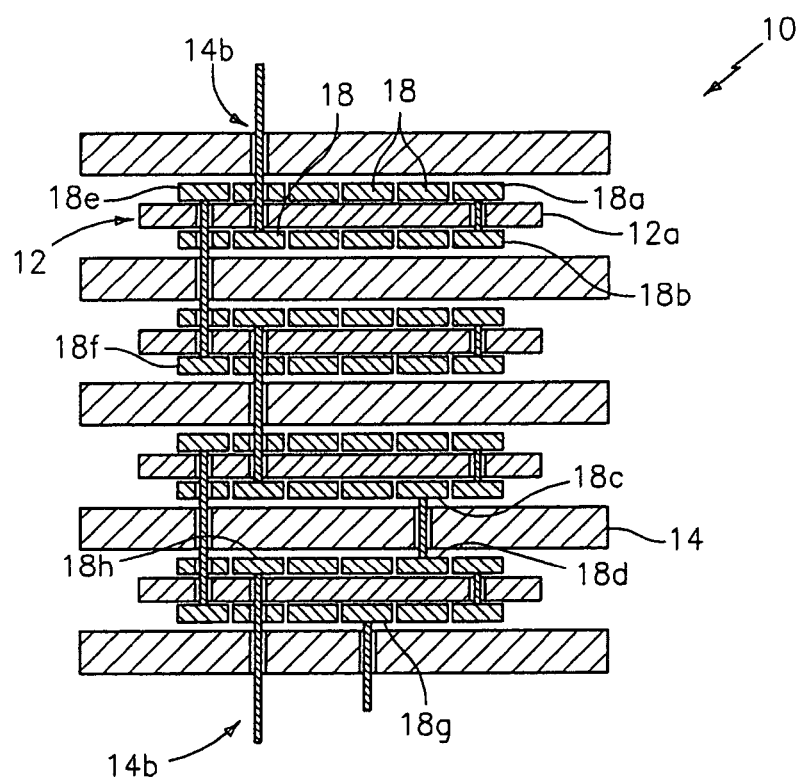
FIG. 5 is a schematic cross-sectional view of the integrated circuit package of FIG. 1A.

A high density IC package is assembled in accordance with this invention by alternately stacking circuitry wafers and cooling plates, as indicated in the schematic representation of FIG. 5. In the embodiment of FIG. 5, circuitry wafers 12 comprise substrates 12a that have IC chips 18 mounted on both sides of the substrates 12a. IC chips 18 include laser chips 18a–18i with associated controllers to enable laser signal communication in the circuitry within IC package 10. For example, laser chips 18a and 18b are mutually aligned with a communication aperture in substrate 12a so that the circuitry on one side of substrate 12a can communicate optically with circuitry on the other side of substrate 12a (i.e., the two laser chips are optically coupled with each other). Similarly, laser chips 18c and 18d are mutually aligned with a communication aperture in a cooling plate so that chips 18c and 18d can communicate with each other optically, thus enabling the circuitry on a circuitry wafer on one side of a cooling plate to communicate through the cooling plate with circuitry on another circuitry wafer on the other side of the cooling plate. Laser chips 18e and 18f can communicate optically because communication apertures on their respective substrates 12a are both aligned with a communication aperture in the intervening cooling plate 14. Thus, it is possible to align communication apertures in both circuitry wafer substrates and cooling plates to permit optical communication through both a substrate 12 and a cooling plate 14.

Laser chips 18g, 18h and 18i are aligned with optical communication channels in the outer (i.e., top and bottom) cooling plates so that they can send and receive optical signals with devices that are external to, and vertically aligned with, the IC package. (As used in this description and in the claims, the vertical direction relative to an IC package is the direction that is orthogonal to the planes in which layered circuitry wafers and cooling plates are disposed, i.e., the vertical direction is the direction in which the circuitry wafers and cooling plates are layered.) Optionally, vertical communication may be used primarily or exclusively for data flow. The external device may comprise a modular optical connector, e.g., an array of optical fiber ends or of solid state optical logic devices, configured to exchange optical signals with optical ICs in the package. Accordingly, the positioning of optical ICs 18g, 18h, etc., for vertical external communication and the pattern of corresponding communication channels in the outer cooling plates are matched to the external device.

Figure 6:
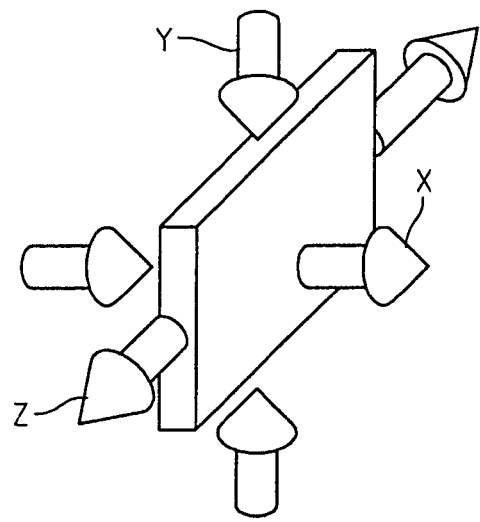
FIG. 6 is a schematic representation of an integrated circuit package according to this invention, showing orthogonal directions of cooling, data and power through the package.

The channels flowing through the cooling plates of FIG. 5 may extend from left to right as sensed in the Figure, a direction that runs parallel to the substrates 12a. The cooling fluid may be supplied to, and collected from, the channels by manifolds which will typically be situated at opposing sides of the package to accommodate a straight fluid flow path through the package. It will therefore be appreciated that the various communication apertures in the substrates 12a and cooling plates 14 permit signal communication between circuitry wafers in a vertical direction that is orthogonal to the places in which coolant flows through the cooling plates in the package. Optionally, data input and output can be directed vertically through the package 10 (as sensed in FIG. 5), whereas electrical power and (optionally) control functions can be provided in a horizontal direction (as sensed in FIG. 5) that is orthogonal to both the direction of coolant flow and the vertical flow of data signal communication, i.e., in a direction perpendicular to the plane of the paper in which FIG. 5 is depicted. Representing the IC package 10 schematically as a rectangular solid in FIG. 6, the architecture of an IC package in accordance with this invention permits coolant to flow through the package 10 in a direction along a "Z" axis; power, data and or control signals communication can be accommodated vertically through the top and/or bottom surfaces and/or vertically within the package, along a vertical or otherwise upward-directed "Y" axis, and/or horizontally along in "X" axis perpendicular or otherwise transverse to both the Y axis and the Z axis. Power, data and control signals can be allocated to the X and/or Y in axis in any desired manner and combination.

It will be understood that IC packages in accordance with this invention need not be limited to rectangular configurations, although a rectangular configuration may allow for convenient connection of the package with other components in the cooling system, power supplies an other electronic components. For a cylindrical package as shown in FIG. 1A, inflow and outflow manifolds (such as manifolds 20a, 20b, FIG. 6A) can be configured to occupy only a portion of the periphery of the package, leaving the remainder of the periphery accessible for the lateral connection of a lateral bus that may optionally primarily provide power and control signals to one or more circuitry wafers.

Figure 6A:
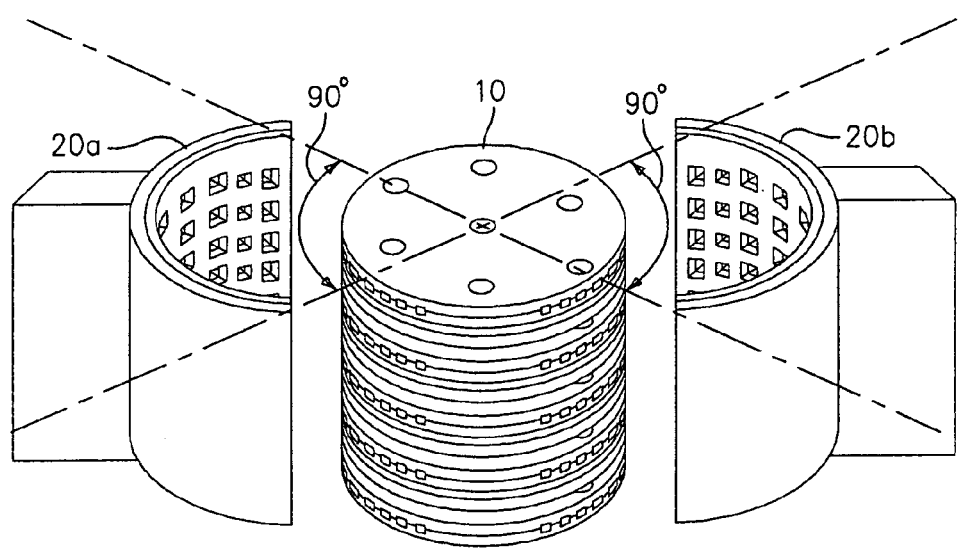
FIG. 6A is a schematic perspective view of an integrated circuit package with two cooling manifolds according to this invention.
Figure 6B:
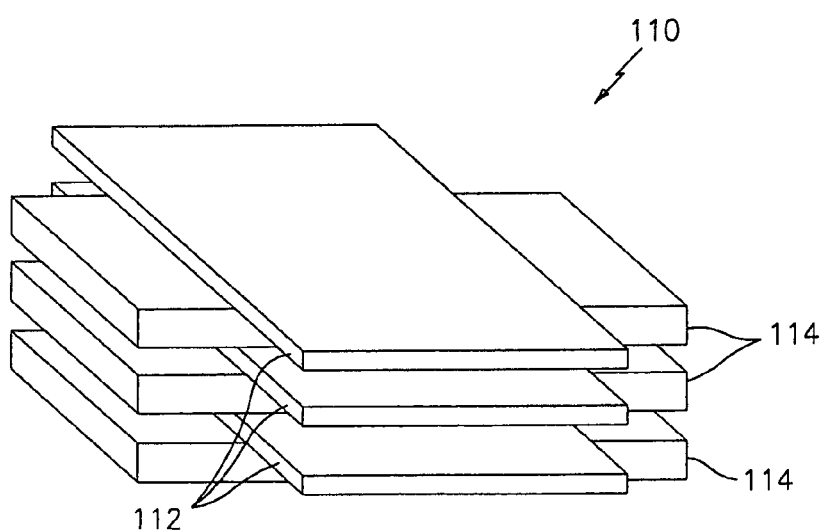
FIG. 6B is a schematic perspective view of an IC package according to another embodiment of this invention.
Figure 6C:
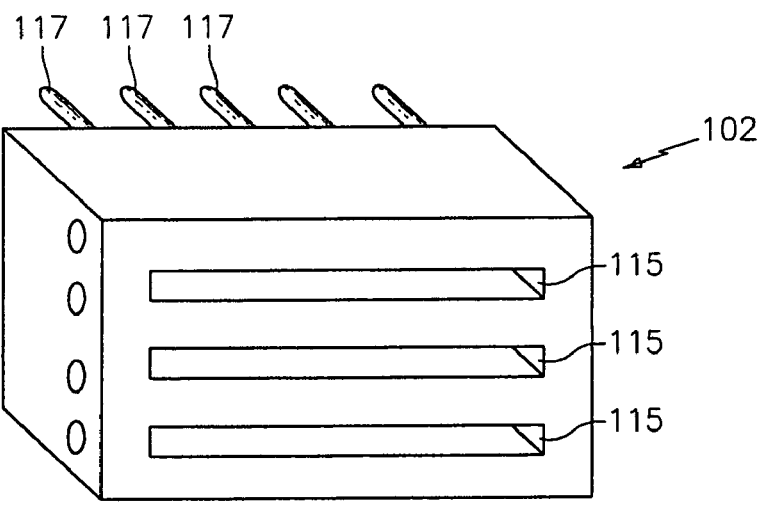
FIG. 6C is a schematic perspective view of a modular connector configured to electrically engage the circuitry wafers of the package of FIG. 6B.
Figure 6D:
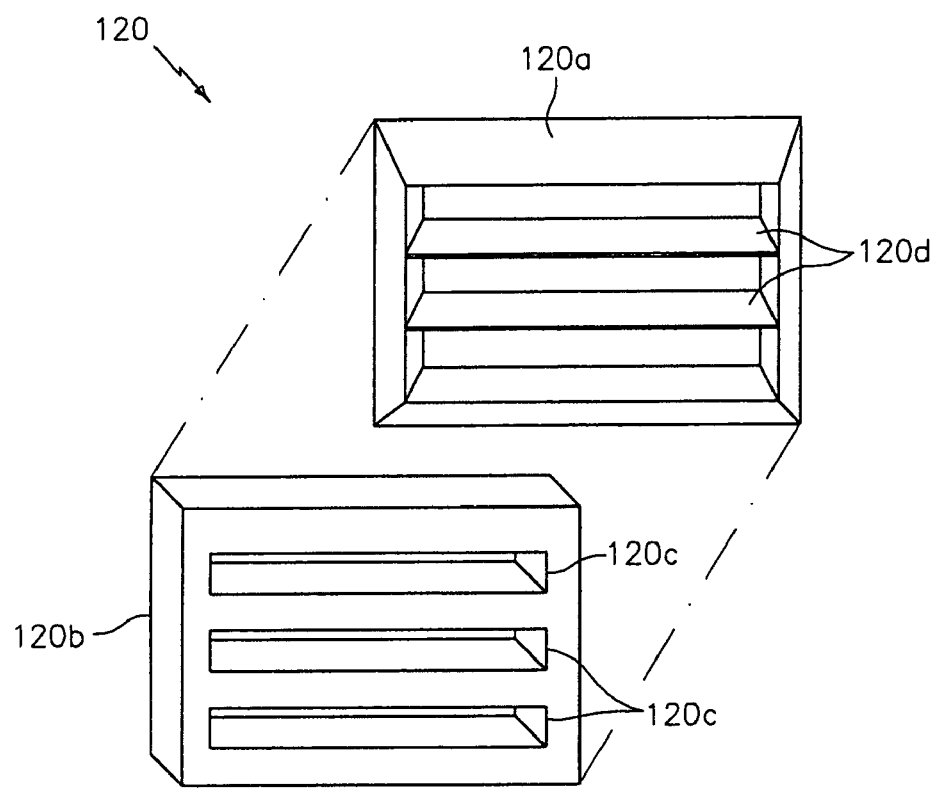
FIG. 6D is a schematic, exploded, perspective view of a cooling manifold for a rectangular IC package according to this invention.

Such, inflow and outflow manifolds facilitate the flow of coolant through the package in a plurality of parallel planes that are disposed in perpendicular relation to the direction in which circuitry wafers and cooling plates are layered in the package. Thus, thermal flow through the package is achieved in a horizontal direction orthogonal to the vertical direction in which circuitry wafers aid cooling plates are layered. Power and signal communication with the package may be provided in the vertical direction and/or in a direction orthogonal to the vertical direction. By positioning an electrical connector between two coolant manifolds, signal communication may also be or orthogonal to the vertical direction and to the direction of heat flow through the package. As shown, inflow coolant manifold 20a occupies only a 90-degree sector of the periphery of the IC package indicated by its circular footprint at IC package 10, and outflow coolant manifold 20b occupies a diametrically opposite 90-degree sector leaving two lateral 90-degree sectors available for lateral connection to a bus for electrical signaling (e.g., for control and/or power and/or data transfer) in a direction orthogonal to the direction or flow of coolant from one manifold to the other, at the regions indicated by arrows 22. Each of manifolds 20a and 20b has a concave face for mating with the stack. Each manifold face carries a deformable gasket material for contact with the stack. The gasket material is perforated in a manner calculated to allow coolant to flow therethrough into or out from the cooling plates and to establish a seal around each of the flow channels. As shown, the gasket material on manifolds 20a and 20b have perforations to match the openings of each flow channel in the cooling layers in IC package 10, but, in alternative embodiments, the gasket may be configured to form a seal around a plurality of such openings in a cooling layer. Accordingly, the circuitry wafers may be configured to include edges with I/O contact pads that protrude from opposite sides of the stack, to facilitate the use of a suitably configured modular electrical connector to that package. Likewise, in an alternative to what is shown in FIG. 6A, the cooling plates may optionally be configured to protrude from the slack, to facilitate the connection of manifolds thereto. Such a connector and manifold are shown in FIGS. 6C and 6D, respectively.

In a generally rectangular embodiment, a package 110 (FIG. 6B) comprises a plurality of circuitry wafers 112 arranged in substantially parallel relation to each other with a plurality of rectangular cooling plates 114 disposed between them to form a stack. The circuitry wafers 112 and cooling plates 114 are rectangular in configuration and are disposed crosswise so that their ends protrude from the stack in mutually orthogonal (i.e., transverse) directions. The protruding ends of circuitry wafers 112 will facilitate the use of a modular electrical bus connector such as connector 102 (FIG. 6C) to facilitate the connection of package 110 to a source of power and, optionally, control signals and/or data signals for circuitry wafers 112. Connector 102 comprises a series of slots 115 that are configured to receive the ends of circuitry wafers 112 and to establish electrical connections between access pins 117 and corresponding contacts on the respective circuitry wafers 112. Connector 102 and circuitry wafers 112 can be configured in a generally conventional manner, e.g., to provide for a zero insertion force connection.

The protrusion of the ends of the cooling plates 114 in package 110 permits the use of cooling fluid manifolds that are slotted to receive the ends of the cooling plates in a manner similar to the way connector 102 receives the ends of the circuitry wafers. A suitable manifold 120, as represented schematically in FIG. 6D (in which the package 10 is shown without circuitry wafers, to simplify the drawing), may comprise a manifold frame 120a and a gasket 120b. Gasket 120b has slots 120c configured to receive the edges of the cooling plates that protrude from the stack, thus forming a seal around the plurality of flow channels in each cooling plate. The gasket 120b is disposed between the manifold frame 120a and the cooling plates, and provides a seal around the cooling plates and between the plates and the frame. Frame 120a includes wedges 120d which are configured to bear against gasket 120b between slots 120c to facilitate the formation of the seal.

Figure 7:
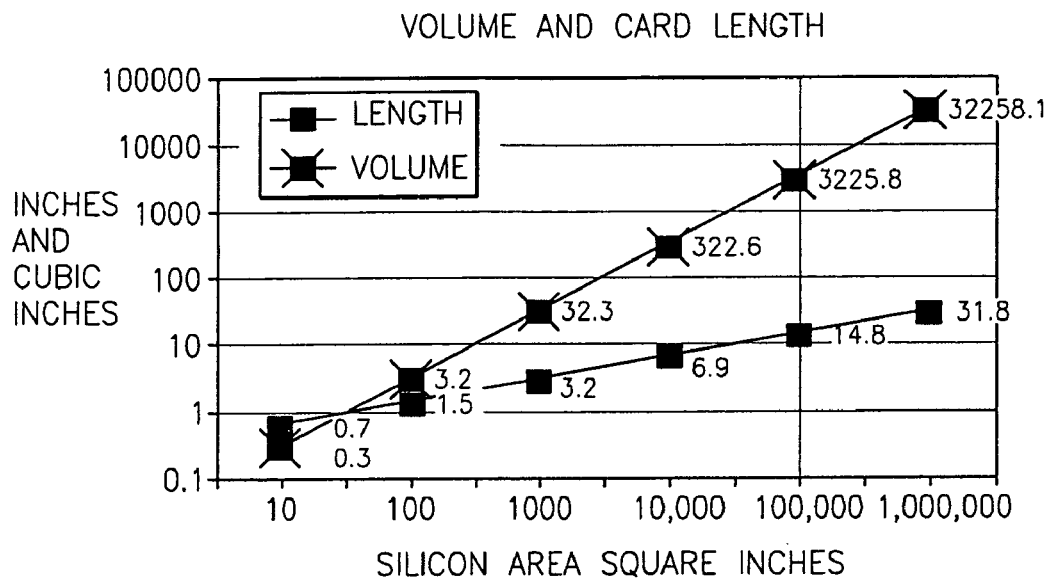
FIG. 7 is a plot of surface area density for an integrated circuit package according to this invention.

One measure of expected performance for an IC package is the amount of surface area that can be dedicated to circuitry within a given volume. The relationship of substrate surface area to volume for an IC package according to this invention is illustrated in FIG. 7. An integrated circuit package having the architecture described herein can provide thirty-two square inches of surface area for interconnected IC chips per cubic inch of volume, i.e., a surface area density D of 32 square inches per cubic inch. In a representative embodiment, D=0.8/w and w=0.025 inch, where w is the thickness of a circuitry wafer substrate and of the IC chips mounted on both sides of the substrate in the IC package, and where the thickness of the cooling plates is 2 w. The formula includes the surface areas of both sides of the surfaces of the IC chips on the substrate and both surfaces of the substrate, so that the total thickness of a circuitry layer (a substrate with chips on both sides) and an associated cooling plate is 5 w.

Figure 8:
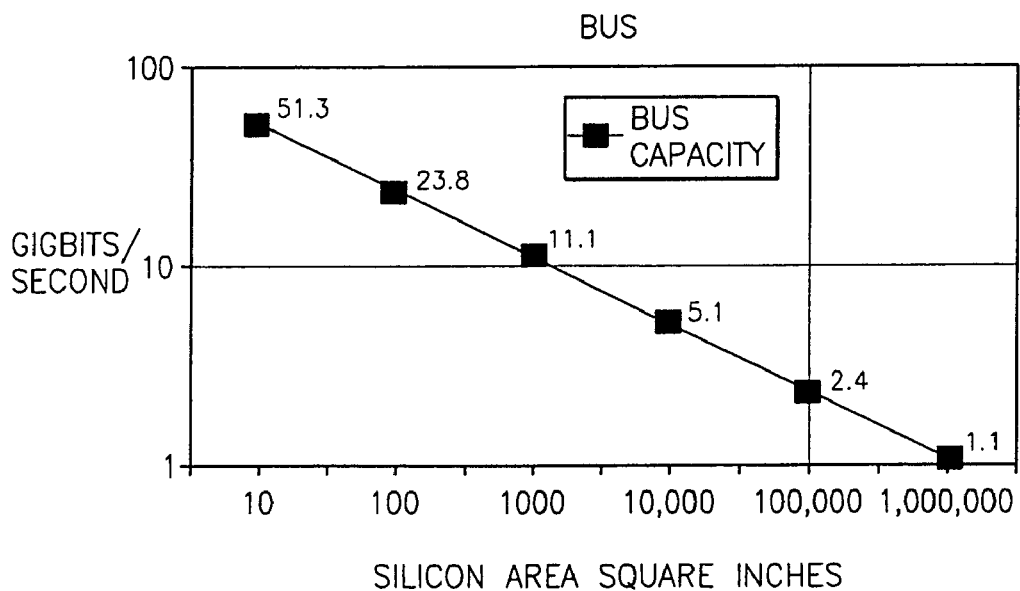
FIG. 8 is a plot showing the relationship between bus capacity and surface area in an integrated circuit package according to this invention.
Figure 9:
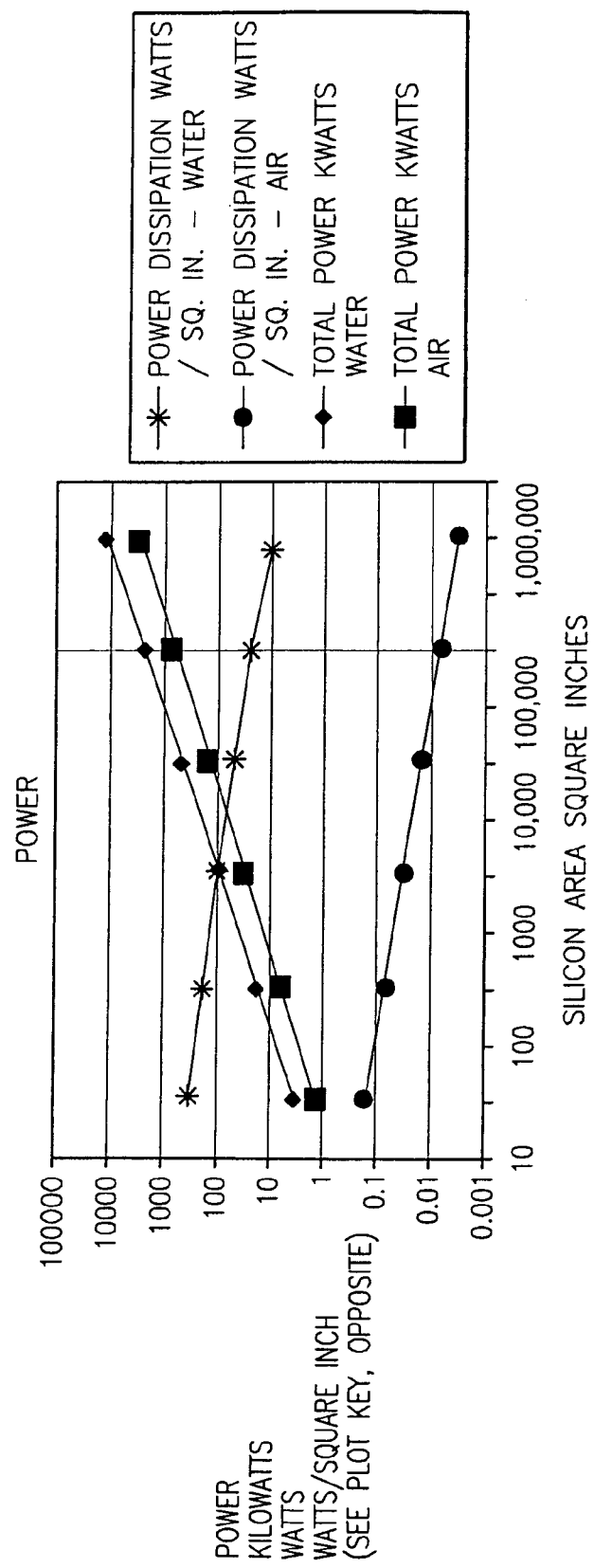
FIG. 9 is a plot showing the relationship between power dissipation and surface area in an integrated circuit package according to this invention.

Another measure of performance is the bus capacity exhibited by the IC package. As illustrated in FIG. 8, the capacity, in gigabits per second, increases as the surface area over which a circuit is deposited decreases, because with decreased surface area there are shorter communication leads, so signals take less time to travel from one transistor (or other circuit element) to the next, making the communication line available more quickly for other signals. An integrated circuit package providing thirty-two square inches of surface area for interconnected IC chips per cubic inch of volume in accordance with this invention will accommodate data transfer at about one gigabit per second per channel. With increased bus capacity, however, there is increased generation of heat. The chart of FIG. 9 illustrates that in an IC package according to this invention, the amount of power consumed by the package increases as the surface area increases, but that power dissipation diminishes with increasing surface area. The power dissipation in an integrated circuit package according to this invention varies according to the type and velocity of coolant flowing through the cooling plates. The expected power dissipation (PD) at a maximum junction temperature $T_j$ of 70° C., using water cooling at a velocity of 8.8 feet per second is PD=339/(L+0.3) watts per square inch of silicon area, and where L is the card length in inches and, using air cooling at a velocity of 88 feet per second, the power dissipation is expected to be PD=0.0975/(L+8.65×10$^{-5}$) watts per square inch.

While the invention has been described in connection with particular embodiments thereof, it will be understood by one of ordinary skill in the art, upon a reading and understanding of the foregoing description, that numerous alterations and variations may be made within the scope of the invention described herein.

What is claimed is:
1. An integrated circuit package comprising:
    a plurality of circuitry wafers each comprising a substrate on which is carried one or more integrated circuits with at least one wafer configured for signal communication outside the package; and a plurality of cooling plates alternately layered with the circuitry wafers;

wherein the circuitry wafers and cooling plates are layered in a first direction that defines a first axis of the package, and wherein signal communication between circuitry wafers within the package occurs in a direction along the first axis;

wherein the cooling plates are configured to direct heat flow in a path that is transverse to the first axis;

wherein at least one of power, data signal and control signal communication is supplied to the package from a direction that is transverse to both the first axis and the direction of heat flow; and comprising cooling plates that define flow conduits therethrough for coolant fluid, wherein each flow conduit has two conduit ends and wherein the conduit ends are aligned at two different positions on the side of the package, and wherein the package further comprises manifolds that provide a port through which to provide coolant fluid to a plurality of flow conduits and a port to collect cooling fluid from a plurality of flow conduits, and wherein the manifolds are configured to permit access to the side of the package for providing at least one of power, data signal and control signal communication to circuitry wafers in the package.

2. An integrated circuit package comprising:

a plurality of circuitry wafers each comprising a substrate on which is carried one or more integrated circuits with at least one circuitry wafer configured for signal communication outside the package; and a plurality of cooling plates alternately layered with the circuitry wafers;

and comprising circuitry wafers and cooling plates configured so that integrated circuits on at least two circuitry wafers in the package communicate with each other through an intervening cooling plate; and further comprising cooling plates that define flow conduits therethrough for coolant fluid, wherein each flow conduit has two conduit ends and wherein the conduit ends are aligned at two different sides of the package, and wherein the package further comprises manifolds that provide a port through which to provide coolant fluid to a plurality of flow conduits and a port to collect cooling fluid from a plurality of flow conduits.

3. The package of claim 1 or claim 2 wherein at least one cooling plate comprises a plate signal path therethrough and wherein a first IC on a circuitry wafer on one side of the cooling plate is positioned for signal communication through the plate signal path.

4. The package of claim 3 comprising a second IC on a circuitry wafer on the other side of the cooling plate, positioned for signal communication with the first IC through the plate signal path.

5. The package of claim 3 wherein the first IC is an optical IC and wherein the plate signal path comprises a plate optical signal path.

6. The package of claim 5 comprising a second optical IC on a circuitry wafer on the other side of the cooling plate, positioned for optical signal communication with the first optical IC through the plate optical signal path.

7. The package of claim 6 comprising a second IC on a substrate positioned for signal communication with the first IC via the substrate signal path.

8. The package of claim 1 or claim 2 wherein at least one circuitry wafer comprises a substrate having a substrate signal path therethrough and wherein a first IC is positioned on the substrate for signal communication therethrough.

9. The package of claim 8 wherein the first IC comprises an optical IC and wherein the substrate signal path comprises a subsume optical signal path.

10. The package of claim 9 comprising a second optical IC on a substrate positioned for optical signal communication with the first optical IC via the substrate optical signal path.

11. The package of claim 1 or claim 2, comprising non-electrically conductive substrates and cooling plates.

12. The package of claim 2 wherein the manifolds are configured to permit access to the side of the package for providing power and/or control signals to circuitry wafers in the package.

13. The package of claim 2 or claim 12 wherein the circuitry wafers and cooling plates are layered in a first direction along a first axis, and wherein the circuitry wafers and cooling plates are configured to permit signal communication between circuitry wafers within the package in a direction along the first axis;

wherein the cooling plates are configured to direct heat flow in a path that is transverse to the first axis; and wherein at least one of power, data signal communication and control signal communication are supplied to the package from a direction that is transverse to both the first axis and the direction of heat flow.

14. An integrated circuit package comprising:

a plurality of circuitry wafers each comprising a substrate on which is carried one or more integrated circuits with at least one circuitry wafer configured for signal communication outside the package; and a plurality of cooling plates alternately layered with the circuitry wafers, including cooling plates that define flow conduits therethrough for coolant fluid, wherein each of the flow conduits has two conduit ends and wherein the conduit ends are aligned at two different sides of the package; and wherein the package further comprises a first manifold that provides a port through which to provide coolant fluid to a plurality of flow conduits and a second manifold that provides a port to collect cooling fluid from the plurality of flow conduits.

15. The package of claim 14, comprising a manifold configured to permit access to the side of the package for providing at least one of power, data signal and control signal communication to circuitry wafers in the package.

* * * * *